(12) United States Patent
Gao

(10) Patent No.: US 8,527,694 B2
(45) Date of Patent: Sep. 3, 2013

(54) METHOD AND APPARATUS FOR UPDATING TABLE ENTRIES OF A TERNARY CONTENT ADDRESSABLE MEMORY

(75) Inventor: Xingfu Gao, Fuzhou (CN)

(73) Assignee: Beijing Star-Net Ruijie Networks Co., Ltd., Beijing (CN)

( * ) Notice: Subject to any disclaimer, the term of this patent is extended or adjusted under 35 U.S.C. 154(b) by 74 days.

(21) Appl. No.: 13/158,262

(22) Filed: Jun. 10, 2011

(65) Prior Publication Data

US 2011/0307655 A1  Dec. 15, 2011

Related U.S. Application Data

(63) Continuation of application No. PCT/CN2010/078298, filed on Nov. 1, 2010.

(30) Foreign Application Priority Data

Jun. 11, 2010 (CN) .......................... 2010 1 0205047

(51) Int. Cl.
- *G06F 12/00* (2006.01)
- *G06F 13/00* (2006.01)
- *G06F 13/28* (2006.01)

(52) U.S. Cl.
USPC .................................. 711/108; 711/E12.001

(58) Field of Classification Search
USPC ........................................ 711/108, E12.001
See application file for complete search history.

(56) References Cited

U.S. PATENT DOCUMENTS

| | | | | |
|---|---|---|---|---|
| 7,233,597 | B2* | 6/2007 | Kumar et al. ................. | 370/401 |
| 7,558,270 | B1* | 7/2009 | Wilford et al. ........... | 370/395.42 |
| 7,558,775 | B1* | 7/2009 | Panigrahy et al. ..................... | 1/1 |
| 7,577,784 | B1* | 8/2009 | Smith ............................ | 711/108 |
| 8,316,151 | B1* | 11/2012 | Ammundi ...................... | 709/240 |
| 2004/0156371 | A1* | 8/2004 | Kumar et al. ................. | 370/401 |
| 2005/0240745 | A1* | 10/2005 | Iyer et al. ...................... | 711/167 |

FOREIGN PATENT DOCUMENTS

| | | |
|---|---|---|
| CN | 1862534 | 11/2006 |
| CN | 1866918 | 11/2006 |
| CN | 1896991 | 1/2007 |
| CN | 101021858 | 8/2007 |
| CN | 101035059 | 9/2007 |
| CN | 101039215 | 9/2007 |
| CN | 101222434 | 7/2008 |
| CN | 101350771 | 1/2009 |
| CN | 101364947 | 2/2009 |

OTHER PUBLICATIONS

Shah, Devavrat et al., "Fast Updating Algorithms for TCAMS," IEEE Micro 21(1):36-47, Jan./Feb. 2001.

* cited by examiner

*Primary Examiner* — Sheng-Jen Tsai
(74) *Attorney, Agent, or Firm* — Schwabe, Williamson & Wyatt, P.C.

(57) ABSTRACT

A method and an apparatus for updating table entries of a TCAM are disclosed. The method comprises: creating a virtual TCAM list, of which respective first TCAM table entries are one-to-one corresponding to respective second TCAM table entries stored in a hardware TCAM; determining, in idle resources of the hardware TCAM, a storage position of a second TCAM table entry to be updated corresponding to a first TCAM table entry to be updated, according to a pre-specified precedence relationship between the storage positions of the first TCAM table entry to be updated and other first TCAM table entry in the virtual TCAM list; and performing an updating operation on the second TCAM table entry to be updated based on the determined storage position. According to the present invention, the storage position of the second TCAM table entry to be updated is selected from the idle resources of the hardware TCAM so far as possible, and thus the problem of a low efficiency in updating table entries because of the rewriting of a lot of other second TCAM table entries caused by updating the second TCAM table entries in the hardware TCAM is overcome.

14 Claims, 5 Drawing Sheets

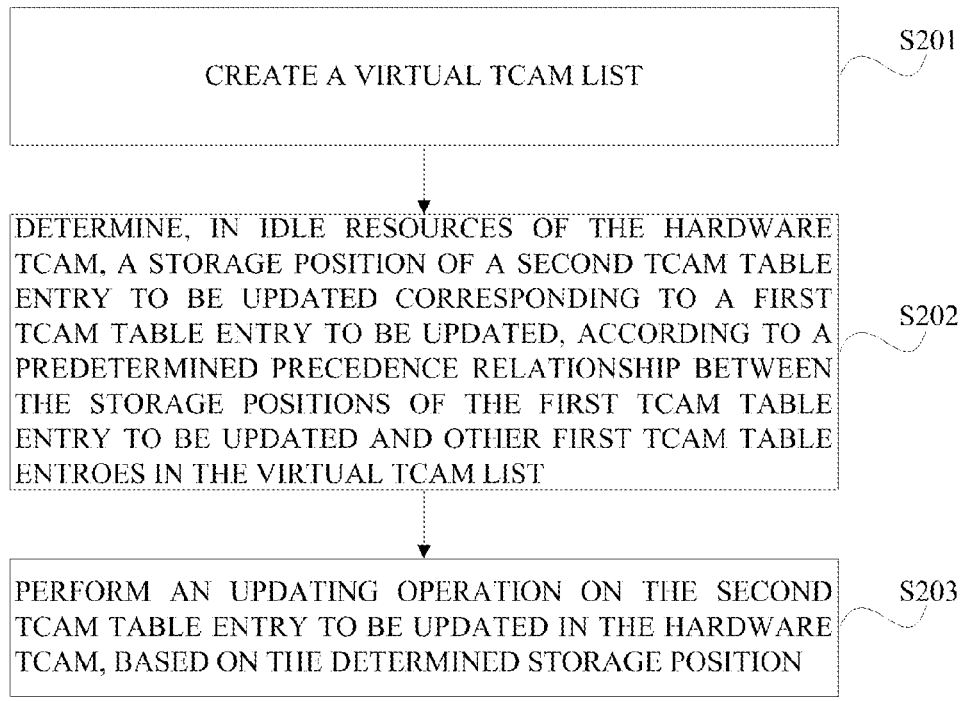

METHOD AND APPARATUS FOR UPDATING TABLE ENTRIES OF A TERNARY CONTENT ADDRESSABLE MEMORY

CROSS-REFERENCE TO RELATED APPLICATIONS

This application is a continuation of International Application No. PCT/CN2010/078298, filed on Nov. 1, 2010, which claims priority to Chinese Patent Application No. 201010205047.3, filed on Jun. 11, 2010, both of which are hereby incorporated by reference in their entireties.

FIELD OF THE INVENTION

The present invention relates to the field of a ternary content addressable memory, and particularly, to a method and an apparatus for updating table entries of a ternary content addressable memory.

BACKGROUND OF THE INVENTION

In network equipments, a Ternary Content Addressable Memory (TCAM) is widely used due to its fast search characteristics. For example, it is used for fast route search, Access Control List (ACL) search, stream-based Quality of Service (QOS), policy-based routing and various safety techniques. In network equipments, a certain content of a message is usually used as an input for the search by the TCAM. The TCAM compares the input with all table entries stored therein, and when a completely matched table entry is found, executes an action bound to the table entry, e.g., discarding the message, allowing to forward the message, or modifying certain information of the message. When a plurality of table entries are completely matched with the input, the headmost one will be taken.

For example, in the application of route prefix search, a destination IP address of an input message is taken as the content to be inputted to the TCAM to search information related to the next hop. Other applications have similar processes. For another example, in the application of ACL search, the user sets "Permit ip host 192.168.1.1; Deny ip any any" and binds it to a port. When the port receives a message, it will extract an input port of the message, a field of protocol type, and a source IP address as the contents to be input to the TCAM for a search. When the message is of IP type and the source IP address is 192.168.1.1, the related TCAM table entry "permit ip host 192.168.1.1" will be hit, and a "permit" action will be executed, i.e., forwarding is allowed; otherwise a "deny" action will be executed for all other messages, i.e., all other messages will be discarded.

Whether the TCAM is used for fast route search or an application such as ACL search, etc., a certain order of the table entries of the TCAM will typically be maintained, i.e., the table entries have a fixed priority relationship thereamong and are stored in a continuous space. The table entries of the TCAM will be continuously updated during the operation of the equipment.

In the prior art methods for updating table entries of the TCAM, when the TCAM contains many table entries, as shown in FIG. 1, in case that a table entry needs to be added between Table Entries 3 and 4, while there is no continuous hardware space of an appropriate size between Table Entries 3 and 4, other table entries may be moved upwards and/or downwards. The addition of one table entry may cause rewriting of a lot of other table entries, which leads to a low efficiency in updating the table entries.

SUMMARY OF THE INVENTION

The present invention provides a method and an apparatus for updating table entries of a TCAM, so as to solve the problem of a low efficiency in updating table entries of the current TCAM.

According to an embodiment of the present invention, a method for updating table entries of a TCAM includes:

creating a virtual TCAM list, in which respective first TCAM table entries are one-to-one corresponding to respective second TCAM table entries stored in a hardware TCAM;

determining, in idle resources of the hardware TCAM, a storage position of a second TCAM table entry to be updated corresponding to a first TCAM table entry to be updated, according to a pre-specified precedence relationship between the storage positions of the first TCAM table entry to be updated and of other first TCAM table entry in the virtual TCAM list; and performing an updating operation on the second TCAM table entry to be updated in the hardware TCAM, based on the determined storage position.

An embodiment of the present invention provides an apparatus for updating table entries of a TCAM, including:

a creating unit configured to create a virtual TCAM list, in which respective first TCAM table entries are one-to-one corresponding to respective second TCAM table entries stored in a hardware TCAM;

a storage position determining unit configured to determine, in idle resources of the hardware TCAM, a storage position of a second TCAM table entry to be updated corresponding to a first TCAM table entry to be updated, according to a pre-specified precedence relationship between the storage positions of the first TCAM table entry to be updated and of other first TCAM table entry in the virtual TCAM list; and an updating operation unit configured to perform an updating operation on the second TCAM table entry to be updated in the hardware TCAM, based on the determined storage position.

The beneficial effects of the embodiments of the present invention are as follows:

The method and apparatus for updating table entries of a TCAM according to the embodiments of the present invention use the one-to-one correspondence between respective first TCAM table entries in the created virtual TCAM list and respective second TCAM table entries in the hardware TCAM, to determine a storage position of the second TCAM table entry to be updated corresponding to the first TCAM table entry to be updated in the idle resources of the hardware TCAM, according to a pre-specified precedence relationship between the storage positions of the first TCAM table entry to be updated and of other first TCAM table entries in the virtual TCAM list, and perform an updating operation on the second TCAM table entry to be updated in the hardware TCAM based on the determined storage position. According to the embodiments of the present invention, the storage position of the second TCAM table entry to be updated is selected from the idle resources in the hardware TCAM so far as possible, thereby overcoming the problem with the prior art that when a second TCAM table entry of the hardware TCAM is directly updated, since the second TCAM table entries of the hardware TCAM are usually stored in a continuous storage space, in order to ensure the precedence relationships between the second TCAM table entry to be updated and other second TCAM table entries, a lot of related second TCAM table entries have to be moved when the second TCAM table entry to be updated causes a position collision, and thus the efficiency in updating the table entries of the hardware TCAM is lower due to rewriting a lot of second TCAM table entries.

BRIEF DESCRIPTION OF THE DRAWINGS

FIG. 1 is a schematic diagram illustrating table entries of a TCAM according to the prior art;

FIG. 2 is a flowchart illustrating a method for updating table entries of a TCAM according to an embodiment of the present invention;

DETAILED DESCRIPTION OF THE EMBODIMENTS

Figure 3:
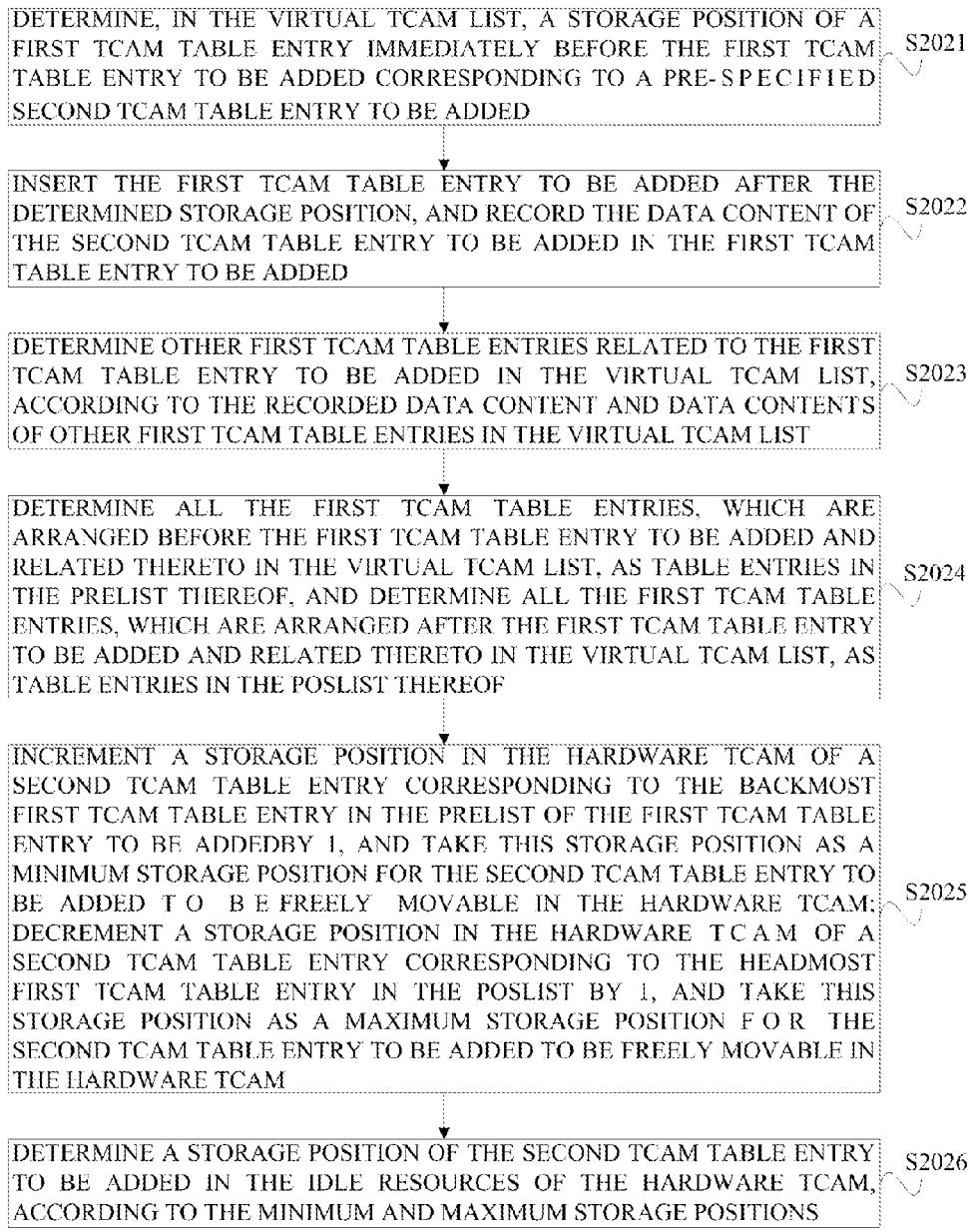
FIG. 3 is a flowchart illustrating a method for determining a storage position of a first TCAM table entry to be added in a hardware TCAM according to an embodiment of the present invention.

A method and an apparatus for updating table entries of a TCAM according to embodiments of the present invention will be described in detail hereinafter with reference to the drawings.

A method for updating table entries of a TCAM according to an embodiment of the invention updates table entries in a physical TCAM, through a series of operations on virtual table entries in a virtual TCAM list implemented by software by means of the one-to-one correspondence between the virtual table entries in the virtual TCAM list and respective table entries in the physical TCAM, which is referred to as a hardware TCAM so as to be distinguished from the software TCAM. For the convenience of description, hereinafter the virtual table entries in the virtual TCAM list are called as first TCAM table entries, and the table entries in the physical TCAM are called as second TCAM table entries. In order to be distinguished from the virtual TCAM list, the physical TCAM is called as a hardware TCAM.

Particularly, as illustrated in FIG. 2, the method for updating table entries of the TCAM according to the embodiment of the invention includes the following steps:

S201: creating a virtual TCAM list, in which respective first TCAM table entries are one-to-one corresponding to respective second TCAM table entries stored in the hardware TCAM;

S202: determining, in idle resources of the hardware TCAM, a storage position of a second TCAM table entry to be updated corresponding to a first TCAM table entry to be updated, according to a pre-specified precedence relationship between the storage positions of the first TCAM table entry to be updated and other first TCAM table entries in the virtual TCAM list;

S203: performing an updating operation on the second TCAM table entry to be updated in the hardware TCAM, based on the determined storage position.

The detailed processes for carrying out the above steps are described as follows.

In step S201, a link list is created as the virtual TCAM list, in which each data node is a first TCAM table entry, and the first TCAM table entries are arranged in a pre-specified order and one-to-one corresponding to respective second TCAM table entries stored in the hardware TCAM.

The record in each first TCAM table entry at least includes the following 6 items:

a data content (represented as data) of the second TCAM table entry corresponding to the first TCAM table entry;

a storage position in the hardware TCAM (represented as tcamID) of the second TCAM table entry corresponding to the first TCAM table entry;

a minimum storage position (represented as minID) for the second TCAM table entry corresponding to the first TCAM table entry to be freely movable in the hardware TCAM;

a maximum storage position (represented as maxID) for the second TCAM table entry corresponding to the first TCAM table entry to be freely movable in the hardware TCAM;

a list of previous table entries (represented as Prelist) of the first TCAM table entry; and a list of posterior table entries (represented as Poslist) of the first TCAM table entry.

In practice, in addition to the above items of the record, the first TCAM table entries may each record an indicator of an idle resource counter preset for counting an amount of idle resources between the minID and the maxID.

The parameters to be recorded by the idle resource counter may include:

minID (an upper limit of the monitoring region of the idle resource counter);

maxID (a lower limit of the monitoring region of the idle resource counter);

referNum (the number of times of referencing the idle resource counter); and

IdleNum (a number of idle second TCAM table entries in the monitoring region of the idle resource counter).

Since the prior art mainly concerns operations of adding and deleting table entries in the hardware TCAM, a lot of table entries may be rewritten and the updating efficiency of the hardware TCAM is low. The method for updating table entries of the TCAM according to the embodiments of the present invention makes improvements to the two updating operations. Steps S202 and S203 as illustrated in FIG. 2 are implemented differently for the different updating operations. The implementation of the two steps is described respectively as follows with respect to the operations of adding and deleting a table entry.

In case of the operation of adding a second TCAM table entry (hereinafter referred to as a second TCAM table entry to be added) in the hardware TCAM, the second TCAM table entry will typically be predetermined to be located after a certain second TCAM table entry having been existed. Correspondingly, in step S202, as illustrated in FIG. 3, the following operations will be carried out on a corresponding first TCAM table entry to be added:

S2021: determining, in the virtual TCAM list, a storage position of a first TCAM table entry immediately before the first TCAM table entry to be added corresponding to the pre-specified second TCAM table entry to be added;

S2022: inserting the first TCAM table entry to be added after the determined storage position, and recording the data contents of the second TCAM table entry to be added in the first TCAM table entry to be added;

S2023: according to the recorded data contents and the data contents of other first TCAM table entries in the virtual TCAM list, determining the other first TCAM table entries related to the first TCAM table entry to be added in the virtual TCAM list;

S2024: determining all the first TCAM table entries, which are arranged before the first TCAM table entry to be added and related thereto in the virtual TCAM list, as table entries in the Prelist thereof; and determining all the first TCAM table entries, which are arranged after the first TCAM table entry to be added and related thereto in the virtual TCAM list, as table entries in the Poslist thereof;

S2025: incrementing a storage position in the hardware TCAM of a second TCAM table entry corresponding to the backmost first TCAM table entry in the Prelist of the first TCAM table entry to be added by 1, and taking this storage position as a minimum storage position (minID) for the second TCAM table entry to be added to be freely movable in the hardware TCAM; and decrementing a storage position in the hardware TCAM of a second TCAM table entry corresponding to the headmost first TCAM table entry in the Poslist by 1, and taking this storage position as a maximum storage position (maxID) for the second TCAM table entry to be added to be freely movable in the hardware TCAM;

S2026: determining a storage position of the second TCAM table entry to be added in the idle resources of the hardware TCAM, according to the minimum and maximum storage positions obtained in step S2025.

Additionally, it may be preferable, after step S2025, to judge whether there is any idle resource in the current hardware TCAM through a preset counter for counting idle resources between the minID and the maxID. Only when the judgment result indicates that there is an idle resource, the procedure will go to step S2026.

The inventor finds that correlation exists between table entries that shall keep a strict precedence relationship among the second TCAM table entries stored in the current hardware TCAM. Accordingly, in step S2023, in the virtual TCAM list, the process of determining other first TCAM table entries related to the first TCAM table entry to be added is a process of determining first TCAM table entries having a strict precedence relationship with the first TCAM table entry to be added.

An embodiment of the present invention determines whether there is correlation between the first TCAM table entry to be added and other first TCAM table entries in the virtual TCAM list under the condition that the first TCAM table entries do not concern layer 4 port number information, and the determination is made by judging whether there is correlation between the data contents of the first TCAM table entry to be added and of other first TCAM table entries as follows.

Firstly, the data contents of the first TCAM table entry to be added and of the other first TCAM table entries in the virtual TCAM list are divided into rule values and masks.

In the prior art, each of the second TCAM table entries may be stored in the hardware TCAM in a form of <rule value (i.e., keyword of address), mask> ordered pairs. For the first TCAM table entries one-to-one corresponding to the second TCAM table entries in the hardware TCAM, the data contents recorded in each of the first TCAM table entries are the rule value and the mask contained in the corresponding second TCAM table entries.

Secondly, for the first TCAM table entry to be added and a certain first TCAM table entry having been existed in the virtual TCAM list, i.e., other first TCAM table entry, an operation of $(N_1 \oplus N_2) \cdot M_1 \cdot M_2$ is carried out.

Herein, $N_1$ is a rule value of the first TCAM table entry to be added, $N_2$ is a rule value of the other first TCAM table entry, $M_1$ is a mask of the first TCAM table entry to be added, and $M_2$ is a mask of the other first TCAM table entry.

The above equation carries out an XOR operation between $N_1$ and $N_2$, and then AND operations with $M_1$ and $M_2$ respectively. When the final operation result is 0, it can be judged that the first TCAM table entry is related to the other first TCAM table entry; otherwise the two table entries are not related to each other.

The principle of the above equation $(N_1 \oplus N_2) \cdot M_1 \cdot M_2$ is described as follows: the XOR operation between $N_1$ and $N_2$ results in a difference between the rule values of the two first TCAM table entries concerned in the operation, then the AND operation between $M_1$ and $M_2$ results in the public mask of the two first TCAM table entries concerned in the operation, then if the result of the AND operation between the difference and the public mask is 0, it means that the difference between the rule values of the two first TCAM table entries concerned in the operation is always not related to the rule value of one of the first TCAM table entries, i.e., there is always no intersection between the difference and the rule value of one of the first TCAM table entries concerned in the operation, and thus it can be judged that the two first TCAM table entries concerned in the operation are related to each other.

The operation process of the above equation is for example described as follows.

It is assumed that the rule value and the mask of the first TCAM table entry to be added are 192.168.5.1 and 255.255.255.255 respectively, and the rule value and the mask of the other first TCAM table entry are 192.168.5.0 and 255.255.255.0 respectively.

The rule value of the first TCAM table entry to be added is a subset of the rule value of the other first TCAM table entry from logical relationship.

According to the above equation, an XOR operation is carried out between 192.168.5.1 and 192.168.5.0 to obtain a result 0.0.0.1.

Then, an And operation is further carried out between the above XOR result 0.0.0.1 and the mask 255.255.255.255 to obtain a result 0.0.0.1.

Then, an And operation is further carried out between the above AND result and the mask 255.255.255.0 to obtain a final result 0.0.0.0.

The final result of the above operation indicates that the first TCAM table entry to be added and the other first TCAM table entry concerned in the operation are related to each other, which is consistent with the result of judgment from the logical relationship.

Figure 4:
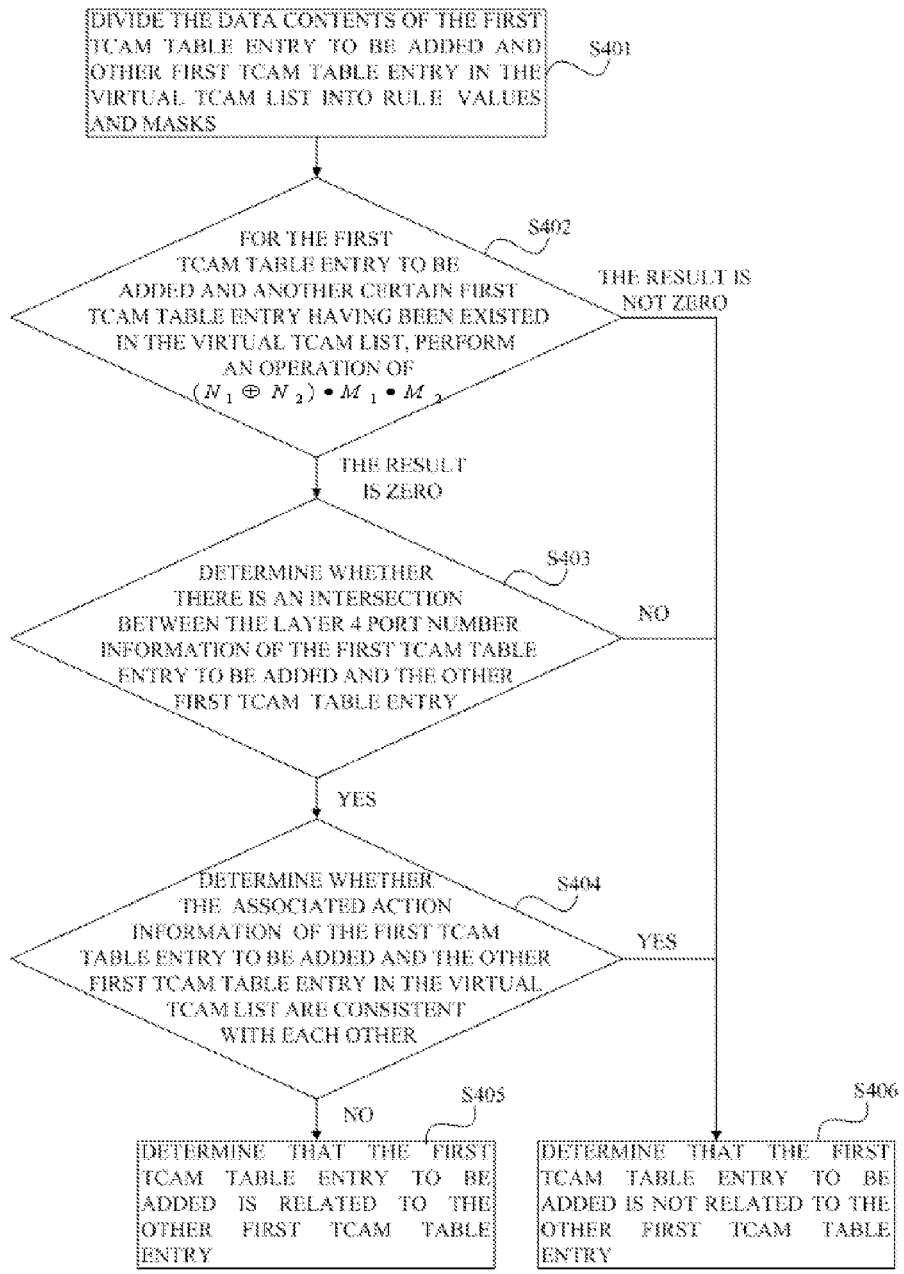
FIG. 4 is a flowchart illustrating a method for judging correlation between data contents of a first TCAM table entry to be added and another first TCAM table entry according to an embodiment of the present invention.

According to a second embodiment, the contents recorded in the first TCAM table entry includes layer 4 port number information and associated action information, in addition to the above 6 items. This is common in current application of ACL. In this embodiment, the process of judging the correlation between the data contents of the first TCAM table entry to be added and of the other first TCAM table entry is illustrated in FIG. 4, including:

S401: dividing the data contents of the first TCAM table entry to be added and the other first TCAM table entries in the virtual TCAM list into rule values and masks;

S402: performing an operation of $(N_1 \oplus N_2) \cdot M_1 \cdot M_2$ for the first TCAM table entry to be added and a certain first TCAM table entry having been existed in the virtual TCAM list (one of the other first TCAM table entries), wherein $N_1$ is a rule value of the first TCAM table entry to be added, $N_2$ is a rule value of the other first TCAM table entry, $M_1$ is a mask of the first TCAM table entry to be added, and $M_2$ is a mask of the other first TCAM table entry, and if the operation result is 0, going to step S403; otherwise going to step S406;

S403: further determining whether there is an intersection between the layer 4 port number information of the first TCAM table entry to be added and the other first TCAM table entry, and if there is an intersection, going to step S404; otherwise turning to step S406;

S404: further determining whether the associated action information of the first TCAM table entry to be added and the other first TCAM table entry in the virtual TCAM list is consistent with each other; if not consistent, going to step S405, and if consistent, going to step S406;

S405: determining that the first TCAM table entry to be added is related to the other first TCAM table entry; and S406: determining that the first TCAM table entry to be added is not related to the other first TCAM table entry.

In step S403, the description statements of the layer 4 port number information can be compared by a layer 4 port comparator. For example, when the layer 4 port number information of the first TCAM table entry to be added and the other first TCAM table entry both describes conditions larger than a certain port number, they obviously have an intersection, thus it can be determined that the first TCAM table entry to be added is related to the other first TCAM table entry.

In step S404, the associated action information recorded in the first TCAM table entry is an execution action corresponding to the first TCAM table entry. For example, for the table entry "Premit tcp any any gt 80 any", "Premit" (i.e., a forwarding is permitted) is the associated action information. In the prior art, there are actions such as discarding message, mirroring, re-orientation, executing a next hop of the route, modifying a certain field of the message, controlling bandwidth, etc. Two first TCAM table entries having the same associated action information are deemed as having no correlation, i.e., there is no strict order between them.

The inventor also finds that in the virtual TCAM list, more bits equal to 1 (i.e., less bits equal to 0) exist in the first TCAM table entry, the first TCAM table entry is more likely to be arranged in the front of the virtual TCAM list. With this characteristic, first TCAM table entries with their masks having more bits equal to 1 are allocated to storage positions in the front so far as possible, which can further reduce table entry movement.

Based on the above principle, when step S2026 is carried out, a possible storage position of a second TCAM table entry to be added in the hardware TCAM is firstly calculated through the following equation:

$$tcamID = N*(maxID - minID + 1) + minID,$$

wherein, tcamID is a possible storage position of the second TCAM table entry to be added in the hardware TCAM, N is a ratio between "0" bits in the mask of the first TCAM table entry to be added and a total bit number of the mask, maxID is a maximum storage position for the second TCAM table entry to be added to be freely movable in the hardware TCAM, and minID is a minimum storage position for the second TCAM table entry to be added to be freely movable in the hardware TCAM.

Next, when the above possible storage position is not occupied in the hardware TCAM, the calculated possible storage position may be taken as a storage position of the second TCAM table entry to be added in the hardware TCAM; on the contrary, when the above possible storage position has been occupied in the hardware TCAM, an idle storage resource may be further searched upwards or downwards from the calculated possible storage position, and an idle position closest to the calculated possible storage position is selected as a storage position of the second TCAM table entry to be added in the hardware TCAM.

In the operation of adding a table entry, after step S2024, the following operations may be performed on the first TCAM table entry existed in the virtual TCAM list:

adding the first TCAM table entry to be added into the Poslist of each of first TCAM table entries in the Prelist of the first TCAM table entry to be added; and adding the first TCAM table entry to be added into the Prelist of each of first TCAM table entries in the Poslist of the first TCAM table entry to be added.

After the first TCAM table entry to be added is inserted into the virtual TCAM list, according to the storage position of the second TCAM table entry to be added in the hardware TCAM, the embodiment of the present invention needs to write the data contents of the second TCAM table entry to be added corresponding to the first TCAM table entry to be added into the storage position.

The operation of deleting a second TCAM table entry (hereinafter referred to as a second TCAM table entry to be deleted) from the hardware TCAM is relatively simple and needs to delete from the hardware TCAM the second TCAM table entry to be deleted according to the storage position of the second TCAM table entry to be deleted recorded in the corresponding first TCAM table entry to be deleted.

Furthermore, the following series of deleting operations shall be performed for the virtual TCAM list:

deleting the first TCAM table entry to be deleted from the Poslist of each of first table entries in the Prelist of the first TCAM table entry to be deleted;

deleting the first TCAM table entry to be deleted from the Prelist of each of first table entries in the Poslist of the first TCAM table entry to be deleted; and finally, deleting the first TCAM table entry to be deleted from the virtual TCAM list.

Based on the same inventive concept, an embodiment of the invention further provides an apparatus for updating table entries of a TCAM. Because the apparatus uses a principle similar to that adopted by the above method for updating table entries of the TCAM, the implementation of the apparatus will be appreciated based on the implementation of the method, and the repeated contents are not described herein.

Figure 5:
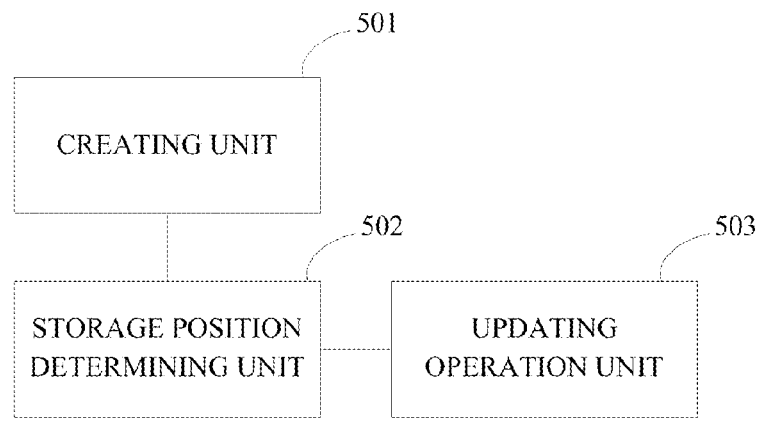
FIG. 5 is a structural diagram illustrating an apparatus for updating table entries of a TCAM according to an embodiment of the present invention.

As illustrate in FIG. 5, the apparatus for updating table entries of the TCAM according to the embodiment of the present invention includes:

a creating unit 501 configured to create a virtual TCAM list, in which respective first TCAM table entries are one-to-one corresponding to respective second TCAM table entries stored in a hardware TCAM;

a storage position determining unit 502 configured to determine, in idle resources of a hardware TCAM, a storage position of the second TCAM table entries to be updated corresponding to the first TCAM table entries to be updated, according to a pre-specified precedence relationship between the storage positions of the first TCAM table entry to be updated and of other first TCAM table entries in the virtual TCAM list; and an updating operation unit 503 configured to perform an updating operation on the second TCAM table entry to be updated in the hardware TCAM, based on the determined storage position.

Figure 6:
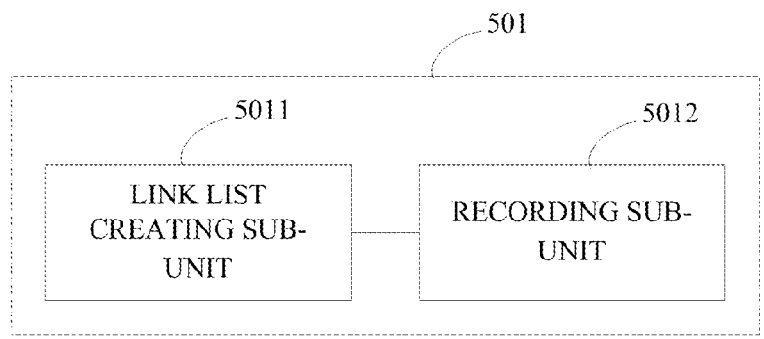
FIG. 6 is a structural diagram illustrating a creating unit according to an embodiment of the present invention.

As illustrated in FIG. 6, the creating unit 501 further includes:

a link list creating sub-unit 5011 configured to create a link list as the virtual TCAM list, in which respective first TCAM table entries are arranged in a pre-specified order and one-to-one corresponding to respective second TCAM table entries stored in the hardware TCAM;

a recording sub-unit 5012 configured to record in each of the first TCAM table entry: the data contents of a second TCAM table corresponding to the first TCAM table entry, a storage position in the hardware TCAM of the second TCAM table entry corresponding to the first TCAM table entry, minimum and maximum storage positions for the second TCAM table entry corresponding to the first TCAM table entry to be freely movable in the hardware TCAM, and Prelist and Poslist of the first TCAM table entry.

Figure 7:
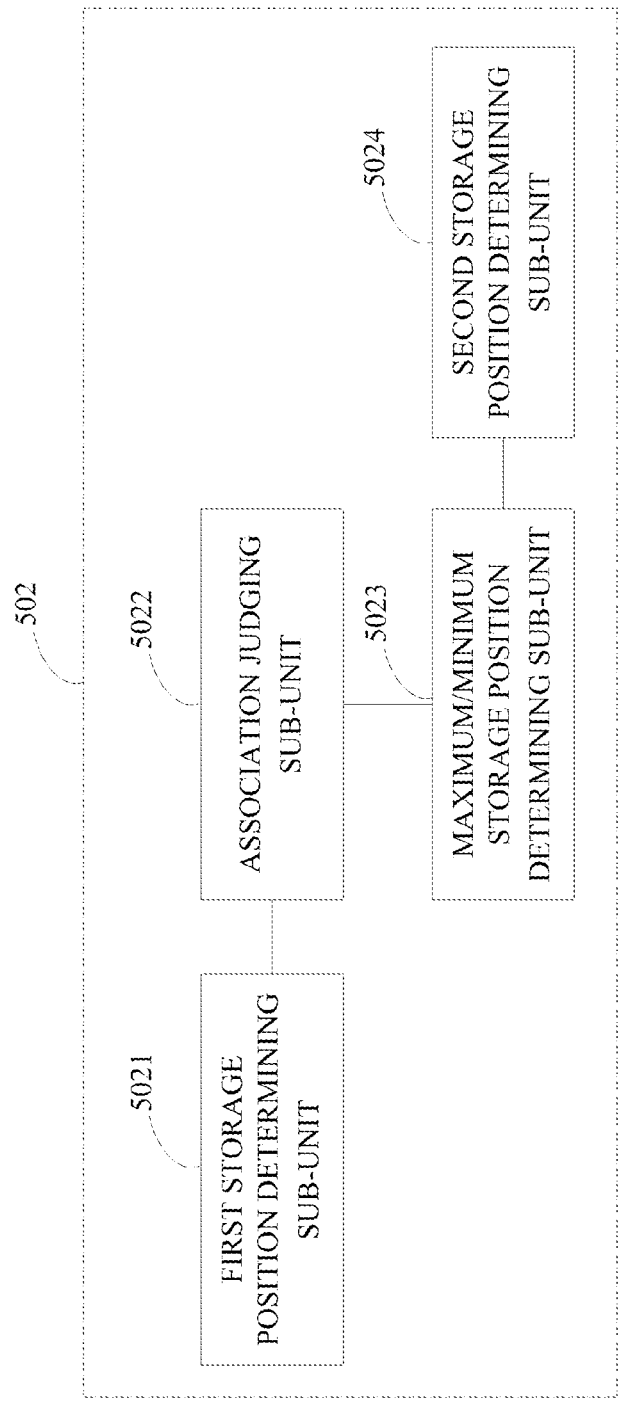
FIG. 7 is a structural diagram illustrating a storage position determining unit according to an embodiment of the present invention.

As illustrated in FIG. 7, the storage position determining unit 502 further includes:

a first storage position determining sub-unit 5021 configured to determine in the virtual TCAM list, a storage position of a first TCAM table entry immediately before a first TCAM table entry to be added corresponding to a pre-specified second TCAM table entry to be added;

a correlation judging sub-unit 5022 configured to insert the first TCAM table entry to be added after the determined storage position, record the data contents of the second TCAM table entry to be added in the first TCAM table entry to be added, and determine other first TCAM table entries related to the first TCAM table entry to be added, according to the recorded data contents and data contents of the other first TCAM table entries in the virtual TCAM list;

a maximum/minimum storage position determining sub-unit 5023 configured to determine all the first TCAM table entries, which are arranged before the first TCAM table entry to be added and related thereto in the virtual TCAM list, as table entries in the Prelist thereof, determine all the first TCAM table entries, which are arranged after the first TCAM table entry to be added and related thereto in the virtual TCAM list, as table entries in the Poslist thereof, increment a storage position in the hardware TCAM of a second TCAM table entry corresponding to the backmost first TCAM table entry in the Prelist of the first TCAM table entry to be added by 1 and take this storage position as a minimum storage position for the second TCAM table entry to be added to be freely movable in the hardware TCAM, and decrement a storage position in the hardware TCAM of a second TCAM table entry corresponding to the headmost first TCAM table entry in the Poslist by 1 and take this storage position as a maximum storage position for the second TCAM table entry to be added to be freely movable in the hardware TCAM; and a second storage position determining sub-unit 5024 configured to determine a storage position of the second TCAM table entry to be added in the idle resource of the hardware TCAM, according to the minimum and maximum storage positions.

The correlation judging sub-unit 5022 is further configured to:

divide the data contents of the first TCAM table entry to be added and of another first TCAM table entry in the virtual TCAM list into rule values and masks;

perform an operation of $(N_1 \oplus N_2) \cdot M_1 \cdot M_2$ for the first TCAM table entry to be added and the other first TCAM table entry, wherein $N_1$ is the rule value of the first TCAM table entry to be added, $N_2$ is the rule value of the other first TCAM table entry, $M_1$ is the mask of the first TCAM table entry to be added, and $M_2$ is the mask of the other first TCAM table entry; and judge that the first TCAM table entry is related to the other first TCAM table entry when the operation result is 0; otherwise judge the two table entries are not related to each other.

The correlation judging sub-unit 5022 is further configured to:

divide the data contents of the first TCAM table entry to be added and of another first TCAM table entry in the virtual TCAM list into rule values and masks;

perform an operation of $(N_1 \oplus N_2) \cdot M_1 \cdot M_2$ for the first TCAM table entry to be added and the other first TCAM table entry, wherein $N_1$ is the rule value of the first TCAM table entry to be added, $N_2$ is the rule value of the other first TCAM table entry, $M_1$ is the mask of the first TCAM table entry to be added, and $M_2$ is the mask of the other first TCAM table entry; and judge that the first TCAM table entry is not related to the other first TCAM table entry when the operation result is not equal to 0; otherwise further judge whether there is an intersection between the layer 4 port number information of the first TCAM table entry to be added and the other first TCAM table entry; if there is no intersection, judge that the first TCAM table entry to be added is not related to the other first TCAM table entry; if there is an intersection, further judge whether the associated action information of the first TCAM table entry to be added and the other first TCAM table entry in the virtual TCAM list is consistent with each other, and if not consistent, judge that the first TCAM table entry to be added is related to the other first TCAM table entry, or if consistent, judge that the first TCAM table entry to be added is not related to the other first TCAM table entry.

Further, the second storage position determining sub-unit 5024 is configure to:

calculate a possible storage position of a second TCAM table entry to be added in the hardware TCAM through the following equation:

$$tcamID = N^*(maxID - minID + 1) + minID,$$

wherein, tcamID is a possible storage position of the second TCAM table entry to be added in the hardware TCAM, N is a ratio between "0" bits in the mask of the first TCAM table entry to be added and a total bit number of the mask, maxID is the maximum storage position, and minID is the minimum storage position;

judge whether the calculated possible storage position is an idle resource of the TCAM, and if the judgment result is "yes", take the calculated possible storage position as a storage position of the second TCAM table entry to be added in the hardware TCAM, or if not, take a storage position of an idle resource closest to the calculated possible storage position as a storage position of the second TCAM table entry to be added in the hardware TCAM.

The maximum/minimum storage position determining sub-unit 5023 is further configured to add the first TCAM table entry to be added into the Poslist of each TCAM table entry in the Prelist of the first TCAM table entry to be added, and add the first TCAM table entry to be added into the Prelist of each TCAM table entry in the Poslist of the first TCAM table entry to be added.

The updating operation unit 503 is further configured to, according to the storage position of the second TCAM table entry to be deleted recorded in a first TCAM table entry to be deleted corresponding thereto, delete from the hardware TCAM the second TCAM table entry to be deleted at the recorded storage position.

The updating operation unit 503 is further configured to delete the first TCAM table entry to be deleted from the Poslist of each first table entry in the Prelist of the first TCAM table entry to be deleted, delete the first TCAM table entry to be deleted from the Prelist of each first table entry in the Poslist of the first TCAM table entry to be deleted, and delete the first TCAM table entry to be deleted from the virtual TCAM list.

The method and apparatus for updating table entries of a TCAM according to the embodiments of the present invention use the one-to-one correspondence between respective first TCAM table entries in the created virtual TCAM list and respective second TCAM table entries in the hardware TCAM, to determine a storage position of the second TCAM table entry to be updated corresponding to the first TCAM table entry to be updated in the idle resources of the hardware TCAM, according to a pre-specified precedence relationship between the storage positions of the first TCAM table entry to be updated and other first TCAM table entries in the virtual TCAM list, and perform an updating operation on the second TCAM table entry to be updated in the hardware TCAM based on the determined storage position.

According to the embodiments of the present invention, the selection of the storage position of the second TCAM table entry to be updated is made within the idle positions in the hardware TCAM so far as possible, which avoids the problem in prior art that when a second TCAM table entry of the hardware TCAM is directly updated, since the second TCAM table entries of the hardware TCAM are usually stored in a continuous storage space, in order to ensure the precedence relationship between the second TCAM table entry to be updated and other second TCAM table entries, a lot of related second TCAM table entries have to be moved when the second TCAM table entry to be updated causes a position collision, and thus the efficiency in updating the table entries of the hardware TCAM is lower because a lot of second TCAM table entries are rewritten.

Further, according to the embodiments of the present invention, the correlation between the first TCAM table entry corresponding to the second TCAM table entry to be updated and other first TCAM table entries in the virtual TCAM list is identified, so that when the second TCAM table entry to be updated causes a position collision, only table entries related to the second TCAM table entry to be updated, which have a strict precedent relationship with the second TCAM table entry to be updated, are moved even there is no idle resource for selection and it is inevitable to move the second TCAM table entries, without moving table entries unrelated to the second TCAM table entry to be updated, which have no strict precedence relationship with the second TCAM table entry to be updated, thereby greatly decreasing the number of the second TCAM table entries that may be moved, and further overcoming the problem of a low efficiency in updating the table entries of the current hardware TCAM.

Apparently, a person skilled in the art can make various changes and modifications to the present invention without deviating from the spirit and the scope of the present invention. Thus, when these changes and modifications to the present invention fall within the scope of the claims and their equivalents, the present invention also intends to cover these changes and modifications.

What is claimed is:

1. A method for updating table entries of a Ternary Content Addressable Memory (TCAM), comprising:
   creating a virtual TCAM list, of which respective first TCAM table entries are one-to-one corresponding to respective second TCAM table entries stored in a hardware TCAM;
   determining, in idle resources of the hardware TCAM, a storage position of a second TCAM table entry to be updated corresponding to a first TCAM table entry to be updated, according to a pre-specified precedence relationship between the storage positions of the first TCAM table entry to be updated and other first TCAM table entry in the virtual TCAM list; and
   performing an updating operation on the second TCAM table entry to be updated in the hardware TCAM, according to the determined storage position,
   wherein the step of creating the virtual TCAM list comprises:
   creating a link list as the virtual TCAM list; and
   arranging first TCAM table entries in the link list in a pre-specified order, and making them be one-to-one corresponding to the respective second TCAM table entries stored in the hardware TCAM;
   wherein each of the first TCAM table entries comprises a data content of a second TCAM table entry corresponding to the first TCAM table entry, a storage position of the second TCAM table entry corresponding to the first TCAM table entry in the hardware TCAM, minimum and maximum storage positions for the second TCAM table entry corresponding to the first TCAM table entry to be freely movable in the hardware TCAM, and a list of previous table entries to the first TCAM table entry, which is called as Prelist and a list of posterior table entries to the first TCAM table entry, which is called as Poslist,
   and wherein when the updating operation is to add a second TCAM table entry, determining, in the idle resources of the hardware TCAM, the storage position of the second TCAM table entry to be updated comprises:
   in the virtual TCAM list, determining a storage position of a first TCAM table entry before a first TCAM table entry to be added corresponding to a pre-specified second TCAM table entry to be added;
   inserting the first TCAM table entry to be added after the determined storage position, and recording the data content of the second TCAM table entry to be added in the first TCAM table entry to be added;
   determining other first TCAM table entries related to the first TCAM table entry to be added, according to the recorded data content and data content of other first TCAM table entries in the first TCAM list;
   determining all first TCAM table entries, which are arranged before the first TCAM table entry to be added and related thereto in the virtual TCAM list, as table entries in the Prelist thereof;
   determining all first TCAM table entries, which are arranged after the first TCAM table entry to be added and related thereto in the virtual TCAM list, as table entries in the Poslist thereof;
   incrementing a storage position in the hardware TCAM of a second TCAM table entry corresponding to a backmost first TCAM table entry in the Prelist by 1, and taking this storage position as the minimum storage position for the second TCAM table entry to be added to be freely movable in the hardware TCAM;
   decrementing a storage position in the hardware TCAM of a second TCAM table entry corresponding to a headmost first TCAM table entry in the Poslist by 1, and taking this storage position as the maximum storage position for the second TCAM table entry to be added to be freely movable in the hardware TCAM;
   determining a storage position of the second TCAM table entry to be added in the idle resources of the hardware TCAM, according to the minimum and maximum storage positions.

2. The method according to claim 1, wherein the step of determining other first TCAM table entries related to the first TCAM table entry to be added comprises:
   dividing the data content of the first TCAM table entry to be added and other first TCAM table entry in the virtual TCAM list into rule values and masks;
   performing an operation of $(N_1 \oplus N_2) \cdot M_1 \cdot M_2$ for the first TCAM table entry to be added and the other first TCAM table entry, wherein $N_1$ is a rule value of the first TCAM table entry to be added, $N_2$ is a rule value of the other first TCAM table entry, $M_1$ is a mask of the first TCAM table entry to be added, and $M_2$ is a mask of the other first TCAM table entry;
   determining that the first TCAM table entry is related to the other first TCAM table entry when the operation result is equal to 0, and otherwise the first TCAM table entry is not related to the other first TCAM table entry.

3. The method according to claim 1, wherein the record of each of the first TCAM table entries further comprises layer 4 port number information and associated action information;
   and wherein the step of determining other first TCAM table entries related to the first TCAM table entry to be added comprises:
   dividing the data content of the first TCAM table entry to be added and other first TCAM table entry in the virtual TCAM list into rule values and masks;
   performing an operation of $(N_1 \oplus N_2) \cdot M_1 \cdot M_2$ for the first TCAM table entry to be added and the other first TCAM table entry, wherein $N_1$ is a rule value of the first TCAM table entry to be added, $N_2$ is a rule value of the other first TCAM table entry, $M_1$ is a mask of the first TCAM table entry to be added, and $M_2$ is a mask of the other first TCAM table entry;
   when the operation result is not equal to 0, determining that the first TCAM table entry is not related to the other first TCAM table entry;
   otherwise further determining whether there is an intersection between the layer 4 port number information of the first TCAM table entry to be added and the other first TCAM table entry; if there is no intersection, determining that the first TCAM table entry to be added is not related to the other first TCAM table entry; if there is an intersection, further determining whether the associated action information of the first TCAM table entry to be added and the other first TCAM table entry in the virtual TCAM list is consistent with each other, and if not, determining that the first TCAM table entry to be added is related to the other first TCAM table entry, while if yes, determining that the first TCAM table entry to be added is not related to the other first TCAM table entry.

4. The method according to claim 1, wherein the step of determining the storage position of the second TCAM table entry to be added in the idle resources of the hardware TCAM according to the minimum and maximum storage positions comprises:
   calculating a possible storage position of the second TCAM table entry to be added in the hardware TCAM through the following equation:

tcamID=$N$*(maxID−minID+1)+minID, wherein tcamID is a possible storage position of the second TCAM table entry to be added in the hardware TCAM, N is a ratio between "0" bits in the mask of the first TCAM table entry to be added and a total bit number of the mask, maxID is the maximum storage position, and minID is the minimum storage position;
   judging whether the calculated possible storage position is an idle resource of the TCAM;
   if the judgment result is "yes", taking the calculated possible storage position as a storage position of the second TCAM table entry to be added in the hardware TCAM; or
   if the judgment result is "no", taking a storage position of an idle resource closest to the calculated possible storage position as the storage position of the second TCAM table entry to be added in the hardware TCAM.

5. The method according to claim 1, further comprising, after the step of determining the Prelist and the Poslist of the first TCAM table entry to be added,
   adding the first TCAM table entry to be added into the Poslist of each of the TCAM table entries in the Prelist of the first TCAM table entry to be added; and
   adding the first TCAM table entry to be added into the Prelist of each of the TCAM table entries in the Poslist of the first TCAM table entry to be added.

6. The method according to claim 1, wherein when the updating operation is to delete a second TCAM table entry, the step of determining, in the idle resources of the hardware TCAM, the storage position of the second TCAM table entry to be updated comprises:
   according to a storage position of the second TCAM table entry to be deleted recorded in a corresponding first TCAM table entry to be deleted, deleting from the hardware TCAM the second TCAM table entry at the storage position.

7. The method according to claim 6, further comprising, before the step of deleting from the hardware TCAM the second TCAM table entry,
   deleting the first TCAM table entry to be deleted from the Poslist of each of the first table entries in the Prelist of the first TCAM table entry to be deleted;
   deleting the first TCAM table entry to be deleted from the Prelist of each of the first table entries in the Poslist of the first TCAM table entry to be deleted; and
   deleting the first TCAM table entry to be deleted from the virtual TCAM list.

8. An apparatus for updating table entries of a TCAM, comprising:
   a creating unit configured to create a virtual TCAM list, of which respective first TCAM table entries are one-to-one corresponding to respective second TCAM table entries stored in a hardware TCAM;
   a storage position determining unit configured to determine, in idle resources of the hardware TCAM, a storage position of a second TCAM table entry to be updated corresponding to a first TCAM table entry to be updated, according to a pre-specified precedence relationship between the storage positions of the first TCAM table entry to be updated and other first TCAM table entries in the virtual TCAM list; and
   an updating operation unit configured to perform an updating operation on the second TCAM table entry to be updated in the hardware TCAM, according to the determined storage position,
   wherein the creating unit further comprises:
   a link list creating sub-unit configured to create a link list as the virtual TCAM list; arrange the first TCAM table entries in the link list in a pre-specified order, and make them be one-to-one corresponding to respective second TCAM table entries stored in the hardware TCAM; and
   a recording sub-unit configured to include the following items in the record of each of the first TCAM table entries: data content of a second TCAM table entry corresponding to the first TCAM table entry; a storage position of the second TCAM table entry corresponding to the first TCAM table entry in the hardware TCAM; minimum and maximum storage positions for the second TCAM table corresponding to the first TCAM table entry to be freely movable in the hardware TCAM, and a Prelist and a Poslist of the first TCAM table entry, and wherein the storage position determining unit further comprises:

a first storage position determining sub-unit configured to determine, in the virtual TCAM list, a storage position of a first TCAM table entry before the first TCAM table entry to be added corresponding to a pre-specified second TCAM table entry to be added;

a correlation judging sub-unit configured to insert the first TCAM table entry to be added after the determined storage position, and record the data content of the second TCAM table entry to be added in the first TCAM table entry to be added; and to determine other first TCAM table entries related to the first TCAM table entry to be added, according to the recorded data content and data content of the other first TCAM table entries in the virtual TCAM list;

a maximum/minimum storage position determining sub-unit configured to determine all first TCAM table entries, which are arranged before the first TCAM table entry to be added and related thereto in the virtual TCAM list, as table entries in the Prelist thereof; to determine all first TCAM table entries, which are arranged after the first TCAM table entry to be added and related thereto in the virtual TCAM list, as table entries in the Poslist thereof; to increment a storage position of a second TCAM table entry corresponding to a backmost first TCAM table entry in the Prelist in the hardware TCAM by 1, and take this storage position as the minimum storage position for the second TCAM table entry to be added to be freely movable in the hardware TCAM; and to decrement a storage position of a second TCAM table entry corresponding to a headmost first TCAM table entry in the Poslist in the hardware TCAM by 1, and take this storage position as the maximum storage position for the second TCAM table entry to be added to be freely movable in the hardware TCAM;

a second storage position determining sub-unit configured to determine a storage position of the second TCAM table entry to be added in the idle resources of the hardware TCAM, according to the minimum and maximum storage positions.

9. The apparatus according to claim 8, wherein the correlation judging sub-unit is further configured to:

divide the data content of the first TCAM table entry to be added and other first TCAM table entry in the virtual TCAM list into rule values and masks;

perform the operation of $(N_1 \oplus N_2) \cdot M_1 \cdot M_2$ for the first TCAM table entry to be added and the other first TCAM table entry, wherein $N_1$ is a rule value of the first TCAM table entry to be added, $N_2$ is a rule value of the other first TCAM table entry, $M_1$ is a mask of the first TCAM table entry to be added, and $M_2$ is a mask of the other first TCAM table entry; and determine that the first TCAM table entry is related to the other first TCAM table entry when the operation result is equal to 0, and otherwise the first TCAM table entry is not related to the other first TCAM table entry.

10. The apparatus according to claim 8, wherein the correlation judging sub-unit is further configured to:

divide the data content of the first TCAM table entry to be added and other first TCAM table entry in the virtual TCAM list into rule values and masks;

perform the operation of $(N_1 \oplus N_2) \cdot M_1 \cdot M_2$ for the first TCAM table entry to be added and the other first TCAM table entry, wherein $N_1$ is a rule value of the first TCAM table entry to be added, $N_2$ is a rule value of the other first TCAM table entry, $M_1$ is a mask of the first TCAM table entry to be added, and $M_2$ is a mask of the other first TCAM table entry;

determine that the first TCAM table entry is not related to the other first TCAM table entry when the operation result is not equal to 0;

otherwise, further determine whether there is an intersection between the layer 4 port number information of the first TCAM table entry to be added and the other first TCAM table entry; if there is no intersection, determine that the first TCAM table entry to be added is not related to the other first TCAM table entry; if there is an intersection, further determine whether the associated action information of the first TCAM table entry to be added and the other first TCAM table entry in the virtual TCAM list is consistent with each other, and if not, determine that the first TCAM table entry to be added is related to the other first TCAM table entry, and if yes, determine that the first TCAM table entry to be added is not related to the other first TCAM table entry.

11. The apparatus according to claim 8, wherein the second storage position determining sub-unit is further configured to:

calculate a possible storage position of the second TCAM table entry to be added in the hardware TCAM through the following equation:

$$tcamID = N^*(maxID - minID + 1) + minID;$$

wherein tcamID is a possible storage position of the second TCAM table entry to be added in the hardware TCAM, N is a ratio between "0" bits in the mask of the first TCAM table entry to be added and a total bit number of the mask, maxID is the maximum storage position, and minID is the minimum storage position;

judge whether the calculated possible storage position is an idle resource of the TCAM;

if the judgment result is "YES", take the calculated possible storage position as a storage position of the second TCAM table entry to be added in the hardware TCAM; or if the judgment result is "NO", take a storage position of an idle resource closest to the calculated possible storage position as a storage position of the second TCAM table entry to be added in the hardware TCAM.

12. The apparatus according to claim 8, wherein the maximum/minimum storage position determining sub-unit is further configured to add the first TCAM table entry to be added into the Poslist of each of the TCAM table entries in the Prelist of the first TCAM table entry to be added, and add the first TCAM table entry to be added into the Prelist of each of the TCAM table entries in the Poslist of the first TCAM table entry to be added.

13. The apparatus according to claim 8, wherein the updating operation unit is further configured to, according to a storage position of a second TCAM table entry to be deleted recorded in a corresponding first TCAM table entry to be deleted, delete from the hardware TCAM the second TCAM table entry at the storage position.

14. The apparatus according to claim 13, wherein the updating operation unit is further configured to delete the first TCAM table entry to be deleted from the Poslist of each of the first table entries in the Prelist of the first TCAM table entry to be deleted, delete the first TCAM table entry to be deleted from the Prelist of each of the first table entries in the Poslist of the first TCAM table entry to be deleted, and delete the first TCAM table entry to be deleted from the virtual TCAM list.

* * * * *